United States Patent
Enzinger et al.

(10) Patent No.: US 12,003,225 B2
(45) Date of Patent: Jun. 4, 2024

(54) METHOD AND APPARATUS FOR NONLINEAR SIGNAL PROCESSING

(71) Applicant: Intel Corporation, Santa Clara, CA (US)

(72) Inventors: Harald Enzinger, Villach (AT); Steffen Trautmann, Villach (AT)

(73) Assignee: Intel Corporation, Santa Clara, CA (US)

(*) Notice: Subject to any disclaimer, the term of this patent is extended or adjusted under 35 U.S.C. 154(b) by 285 days.

(21) Appl. No.: 17/306,986

(22) Filed: May 4, 2021

(65) Prior Publication Data
US 2021/0384891 A1 Dec. 9, 2021

Related U.S. Application Data

(60) Provisional application No. 63/034,448, filed on Jun. 4, 2020.

(51) Int. Cl.
| | | |
|---|---|---|
| *H03H 11/04* | (2006.01) | |
| *H03G 3/30* | (2006.01) | |
| *H03H 11/12* | (2006.01) | |
| *H03H 21/00* | (2006.01) | |

(52) U.S. Cl.
CPC ....... *H03H 11/1291* (2013.01); *H03G 3/3042* (2013.01); *H03H 11/0405* (2013.01); *H03H 21/0012* (2013.01); *H03H 2011/0494* (2013.01); *H03H 2021/0079* (2013.01)

(58) Field of Classification Search
CPC ....... H03H 11/0405; H03H 2011/0494; H03H 2021/0079; H03H 21/0012; H03G 3/3042
See application file for complete search history.

(56) References Cited

U.S. PATENT DOCUMENTS 9,900,016 B1   2/2018  Trampitsch et al.
2006/0133470 A1* 6/2006  Raz ................... H03H 21/0016
                                                                  375/232

OTHER PUBLICATIONS

Tehrani Ali Soltani et al: "A Comparative Analysis of the Complexity/Accuracy Tradeoff in Power Amplifier Behavioral Models"; IEEE Transactions on Microwave Theory and Techniques, vol. 58, No. 6, Jun. 2010, pp. 1510-1520.
Morgan Dennis R. et al: "A Generalized Memory Polynomial Model for Digital Predistortion of RF Power Amplifiers"; IEEE Transactions on Signal Processing, vol. 54, No. 10, Oct. 2006, pp. 3852-3860.

(Continued)

*Primary Examiner* — Rahel Guarino
(74) *Attorney, Agent, or Firm* — 2SPL Patent Attorneys PartG mbB; Yong Beom Hwang

(57) ABSTRACT

The present disclosure relates to a concept of nonlinear signal processing which may be used for predistortion for RF power amplifiers. The concept includes generating time variant filter coefficients for a linear filter circuit based on a nonlinear mapping of an input signal, and filtering the input signal with the linear filter circuit using the time variant filter coefficients in order to generate a filtered output signal. Thus, it is proposed to implement a non-linear filter by a time-varying linear filter where the time-varying coefficients are derived from the input signal.

16 Claims, 10 Drawing Sheets

(56) References Cited

OTHER PUBLICATIONS

Gilabert Pere L. et al: "Multi-Lookup Table FPGA Implementation of an Adaptive Digital Predistorter for Linearizing RF Power Amplifiers With Memory Effects", IEEE Transactions on Microwave Theory and Techniques, vol. 56, No. 2, Feb. 2008, pp. 372-384.

Enzinger Harald: "Vehavioral Modeling and Digital Predistortion of Radio Frequency Power Amplifiers"; Doctoral Thesis, submitted to Graz University of Technology, Austria, Jan. 2018.

* cited by examiner

US 12,003,225 B2

METHOD AND APPARATUS FOR NONLINEAR SIGNAL PROCESSING

FIELD

The present disclosure generally relates to methods and apparatuses for nonlinear signal processing and, more particularly, to methods and apparatuses for compensating non-linear distortion produced by radio frequency (RF) power amplifiers (PAs).

BACKGROUND

To improve the signal quality of wireless transmitters, nonlinear distortion produced by radio frequency power amplifiers can be pre-compensated by digital signal processing in a digital baseband section of a transmitter. This can be done with a nonlinear signal processing structure in digital hardware.

The digital predistortion (DPD) of RF-PAs becomes increasingly important for wireless gateways. A wireless gateway routes packets from a wireless local area network (WLAN) to another network, wired or wireless wide area network (WAN), for example. Wi-Fi is a family of wireless networking technologies, based on the IEEE 802.11 family of standards, which are commonly used for local area networking of devices and Internet access. For Wi-Fi gateways it is common practice that the RF-PA is integrated in a front-end module (FEM) that comes from an external supplier. Therefore, Wi-Fi chipset manufacturers have typically access to the same RF-PAs with the same performance limitations. With the increasing signal bandwidths (320 MHz) and linearity requirements (4 k QAM), it becomes hard for RF-PA manufacturers to meet the requirements. Here, DPD can help to compensate the performance gap between new requirements and available hardware. The increasing performance requirements lead to high power consumption, up to a point where the heat dissipation within a Wi-Fi gateway becomes problematic. To counteract this problem, RF-PA manufacturers introduce more power-efficient, but highly nonlinear RF-PAs in the market. For these PAs, DPD is a must-have since they would be too nonlinear to be operated without DPD.

In previous solutions for implementing nonlinear filters for compensating nonlinear distortion, delayed samples of an input signal are processed by several nonlinear elements in parallel, followed by a sum over the outputs of these nonlinear elements. Memory effects may be included in the predistortion model, which may be essential as the bandwidth increases. It has been found that the so-called generalized memory polynomial (GMP) model provides the highest levels of accuracy to date.

One drawback of previous solutions for implementing the class of GMP filters is that these structures still require significant more multiplications than linear filters. In the case of linear finite impulse response (FIR) filters, the number of multiplications scales with the number of signal taps. In previous solutions for implementing GMP filters, however, the number of multiplications scales with the number of signal taps, multiplied by the number of envelope taps.

For the DPD of RF-PAs, it may be important to keep the computational complexity of the nonlinear filter low, since it is operated at a high clock frequency during regular TX operation. High current consumption of the DPD may diminish the potential power-efficiency improvement that can be achieved by using power-efficient but nonlinear RF-PAs.

BRIEF DESCRIPTION OF THE FIGURES

Some examples of apparatuses and/or methods will be described in the following by way of example only, and with reference to the accompanying figures, in which FIG. 1A, B, C show comparisons of high-power PA and low-power PA, with and without DPD.

DETAILED DESCRIPTION

Figure 1A:
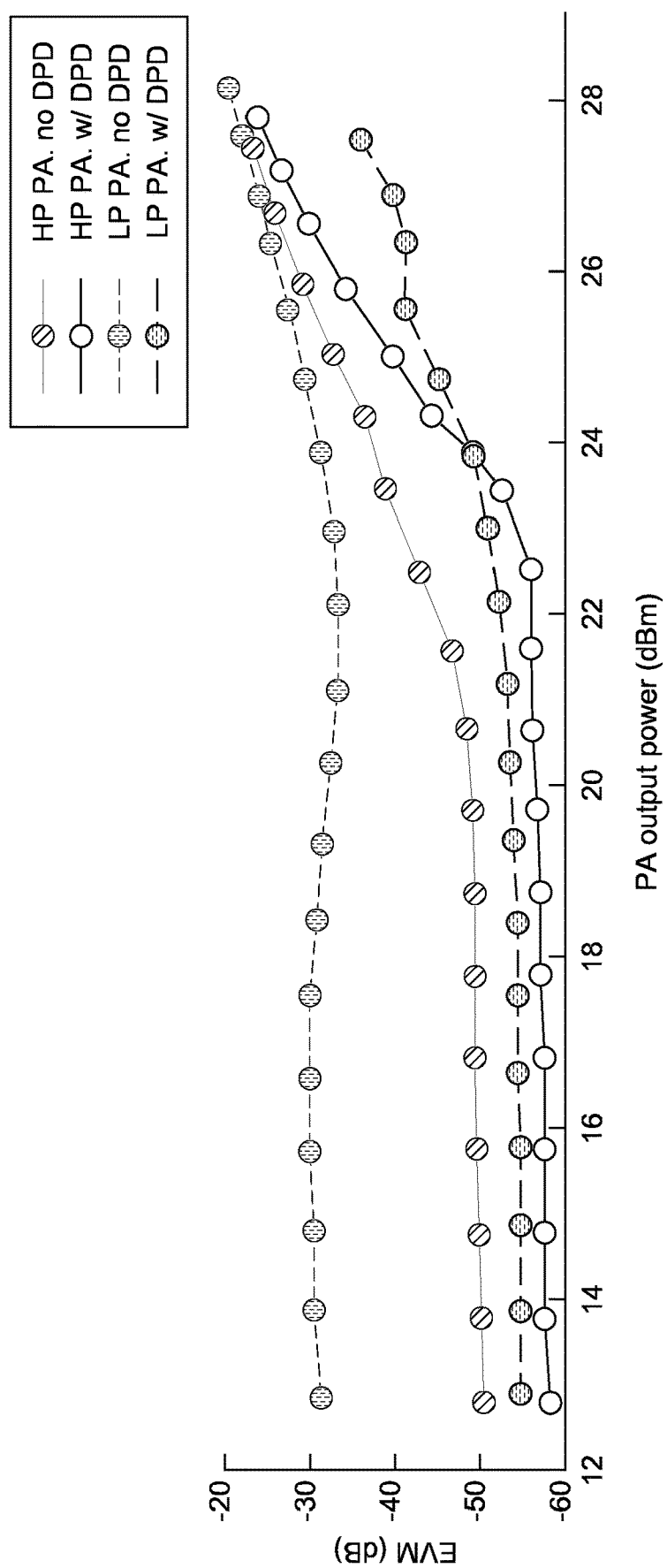

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

To demonstrate the effects of DPD, FIG. 1 shows a comparison between a high-power standard PA (HP PA) and a low-power nonlinear PA (LP PA) with and without DPD support.

FIG. 1A compares the in-band performance in error vector magnitude (EVM) versus output power, with EVM being equivalent to a negative signal-to-noise and distortion ratio (SNDR) information in dB. Maximum data rate at the highest modulation scheme in IEEE 802.11ax transmission requires an EVM of −40 dB or lower. Accordingly, the low-power PA would not be applicable without DPD, but even outperforms the standard PA at higher power levels when combined with DPD.

Figure 1B:
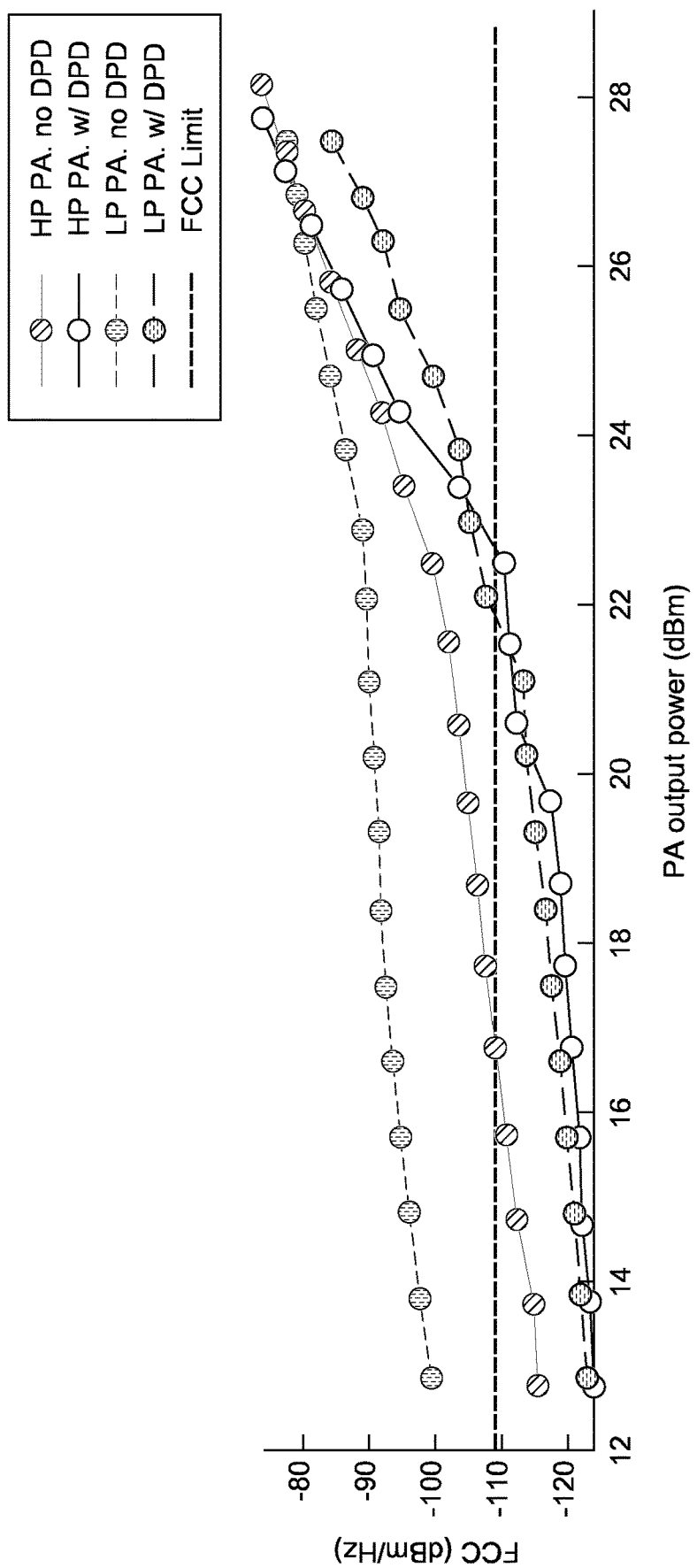

FIG. 1B shows the out-of-band (OOB) Power-Spectral-Density (PSD) level close to the edge of the signal band against a limit for 4-antenna transmission defined by the US Federal Communications Commission (FCC). Without DPD, the low-power PA does not reach the required level, and the standard PA fulfills the FCC limit only up to ~16.5 dBm. Including DPD, the OOB leakage of both PAs is significantly reduced, fulfilling the FCC limit up ~22 dBm. Again, at higher power levels the LP PA with DPD shows better leakage reduction than the standard PA.

Figure 1C:
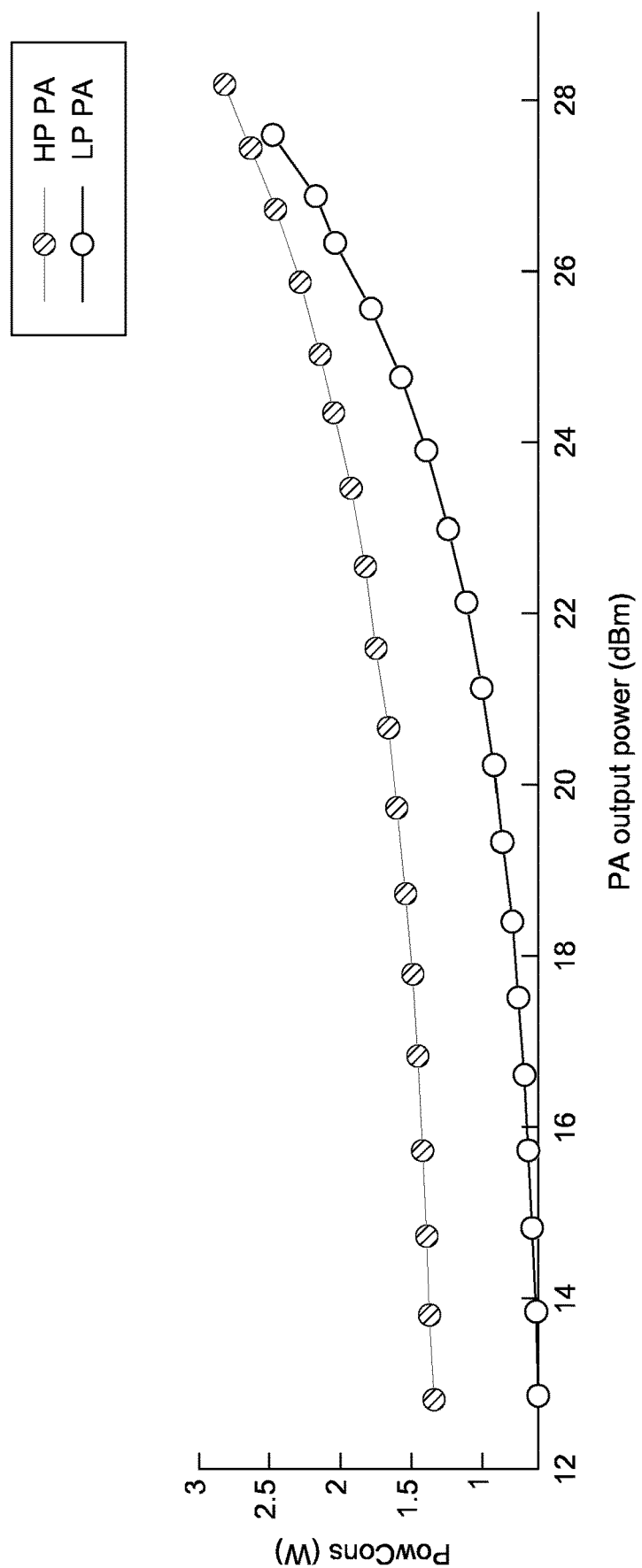

FIG. 1C demonstrates how much power could be saved when using a DPD-supported low-power PA instead of a standard PA. E.g. at 20 dBm, the low-power PA reduces power consumption by more than 600 mW per antenna which sums up to an impressive 2.5 W in a typical 4-antenna Wi-Fi gateway configuration.

According to the findings of the present disclosure, a nonlinear filter can be implemented efficiently by a time-varying linear filter where the time-varying coefficients are derived from an input signal. By applying this finding to GMP filters, it can be shown how they can be implemented by using not more multipliers than would be needed for a linear finite impulse response (FIR) filter of the same memory depth.

Figure 2:
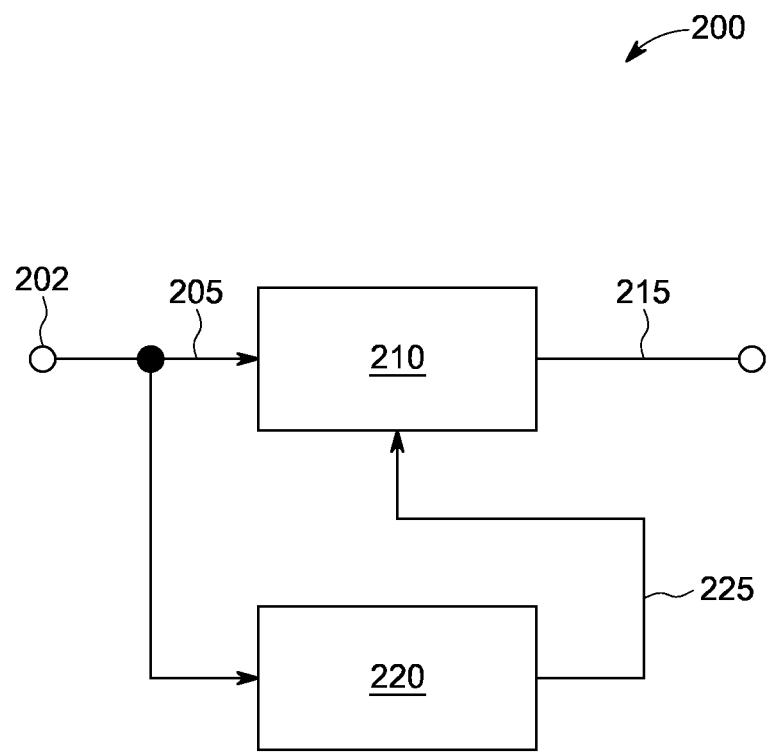
FIG. 2 shows a block diagram of a nonlinear signal processing device in accordance with the present disclosure.

FIG. 2 illustrates an overview of a nonlinear signal processing device 200 in accordance with the present disclosure.

The nonlinear signal processing device 200 comprises a linear filter circuit 210 which is configured to filter an input signal 205 in order to generate a filtered output signal 215. The nonlinear signal processing device 200 further comprises a coefficient generation circuit 220 which is configured to generate time variant filter coefficients 225 for the linear filter circuit 210 based on a nonlinear mapping of the input signal 205 to the filter coefficients 225. In the illustrated example, an input port 202 for the input signal 205 is coupled to an input of the linear filter circuit 210 and to an input of the coefficient generation circuit 220. An output of the coefficient generation circuit 220 is coupled to the linear filter circuit 210 to provide the time variant filter coefficients 225 for the linear filter circuit 210. An output of the linear filter circuit 210 provides the filtered output signal 215 to other circuit components (not shown), such as Digital-to-Analog-Converter (DACs) or power amplifiers (PAs), for example.

In some example implementations, the filter circuit 210 may be implemented as a discrete-time, digital, linear FIR filter whose impulse response (or response to any finite length input) is of finite duration, because it settles to zero in finite time.

In some example implementations, the input signal 205 may be a discrete-time, digital input signal. It may be a real- or complex-valued signal, depending on the implementation. Likewise, the linear filter circuit 210 may comprise a real- or complex-valued linear filter.

In some example implementations, coefficient generation circuit 220 may comprise a non-linear (or non-linear) filter whose output (the time variant filter coefficients 225) is not a linear function of its input (input signal 205).

The skilled person having benefit from the present disclosure will appreciate that the non-linear signal processing device 200 may be implemented in hardware and/or in software.

With the proposed architecture, the complexity of the GMP filter in terms of logic gate count may be decreased to a level close to the complexity of a linear FIR filter of the same memory depth. In some example implementations, the computation of the time-varying coefficients 225 can be implemented efficiently by lookup-tables, requiring only minor additional logic gates.

In the proposed architecture, linear memory and nonlinear memory may be decoupled, which may simplify scaling and re-configuration of the structure. A consequence of this decoupling is that the number of individual memory banks may only be equal to the number of GMP diagonals, whereas in previous solutions this number was the sum of the number of GMP diagonals and the number of linear memory taps.

For implementing the central computational element of the proposed design, which may be the linear FIR filter 210, there are plenty of implementations available. Therefore, this architecture allows for a higher reuse in very-large-scale integration (VLSI) design.

In some example implementations, the coefficient generation circuit 220 may be configured to extract at least one (time variant) numerical feature from the (time variant) input signal 205 and to generate the time variant filter coefficients 225 based on a nonlinear mapping of the extracted time variant numerical feature. The nonlinear mapping may be time invariant (predefined). The skilled person having benefit from the present disclosure will appreciate that the nonlinear mapping may depend on a nonlinearity of a RF-PA. Thus, if the nonlinearity of the RF-PA changes, for example due to aging and/or temperature, the non-linear mapping of the coefficient generation circuit 220 may change as well. This may be done via previous calibration(s) and/or adaptive calculations.

In some example implementations, the extracted numerical feature may comprise an absolute value, a magnitude, a distance, or a norm of the (real or complex) input signal 205.

In some example implementations, the input signal 205 may be a digital input signal and the coefficient generation circuit 220 may be configured to extract the time variant numerical feature for each sample of the digital input signal. For example, the coefficient generation circuit 220 may be configured to compute the absolute value (magnitude) of each complex-valued input signal sample. This may be particularly useful, if a GMP filter is to be mimicked by the nonlinear signal processing device 200.

In some example implementations, the coefficient generation circuit 220 may comprise a nonlinear filter circuit configured to map the at least one extracted time variant numerical feature (e.g., absolute value or magnitude) to the time variant filter coefficients 225.

In some example implementations, the nonlinear filter circuit may comprise a plurality of nonlinear FIR filter taps, wherein each nonlinear FIR filter tap may be configured to delay and map the extracted numerical feature to a respective filter tap output vector based on a respective time invariant nonlinear function. In contrast to a linear FIR filter, which would contain multipliers, this nonlinear filter may contain single-input multiple-output non-linear functions to map the (delayed) numerical features to a respective filter tap output vector.

In some example implementations, the nonlinear filter circuit may be configured to generate the time variant filter coefficients 225 based on a sum of the filter tap output vectors of the nonlinear FIR filter taps.

In some example implementations, the respective nonlinear functions corresponding to the nonlinear FIR filter taps may be implemented based on lookup-tables, polynomials, or any other method for implementing nonlinear memoryless mappings.

In some example implementations, the nonlinear filter circuit 210 may comprise a non-linear FIR filter implemented in direct or transposed form.

A finite impulse response (FIR) digital filter implements the following convolution sum $$y(n)=\Sigma_{n=0}^{N-1}h(k)x(n-k) \quad (1)$$

for each output sample y(n), where x(n) is the discrete-time input signal, h(n) is the filter's impulse response, and N is the filter length. The values h(n) are also called filter taps, and N is then referred to as the number of taps. The filter described by Equation (1) is also called an N-tap filter. Direct-form and transposed direct-form are just different implementations, i.e. different ways to compute the sum in (1). In theory they are identical, but when computed with finite precision or for time-variant filtering, there can be differences between the different implementations. The direct-form FIR structure is also called tapped delay line or transversal filter.

In some example implementations, the linear filter circuit 210 may comprise a linear FIR filter implemented in transposed form.

In some example implementations, the nonlinear signal processing device 200 may further comprise delay circuitry coupled between an input terminal 202 and the linear filter circuit 210, wherein the delay circuitry is configured to delay the input signal 205 by one or more samples. In some example implementations, the delay of the delay circuitry may correspond to a signal processing delay of the coefficient generation circuit 220.

Figure 3:
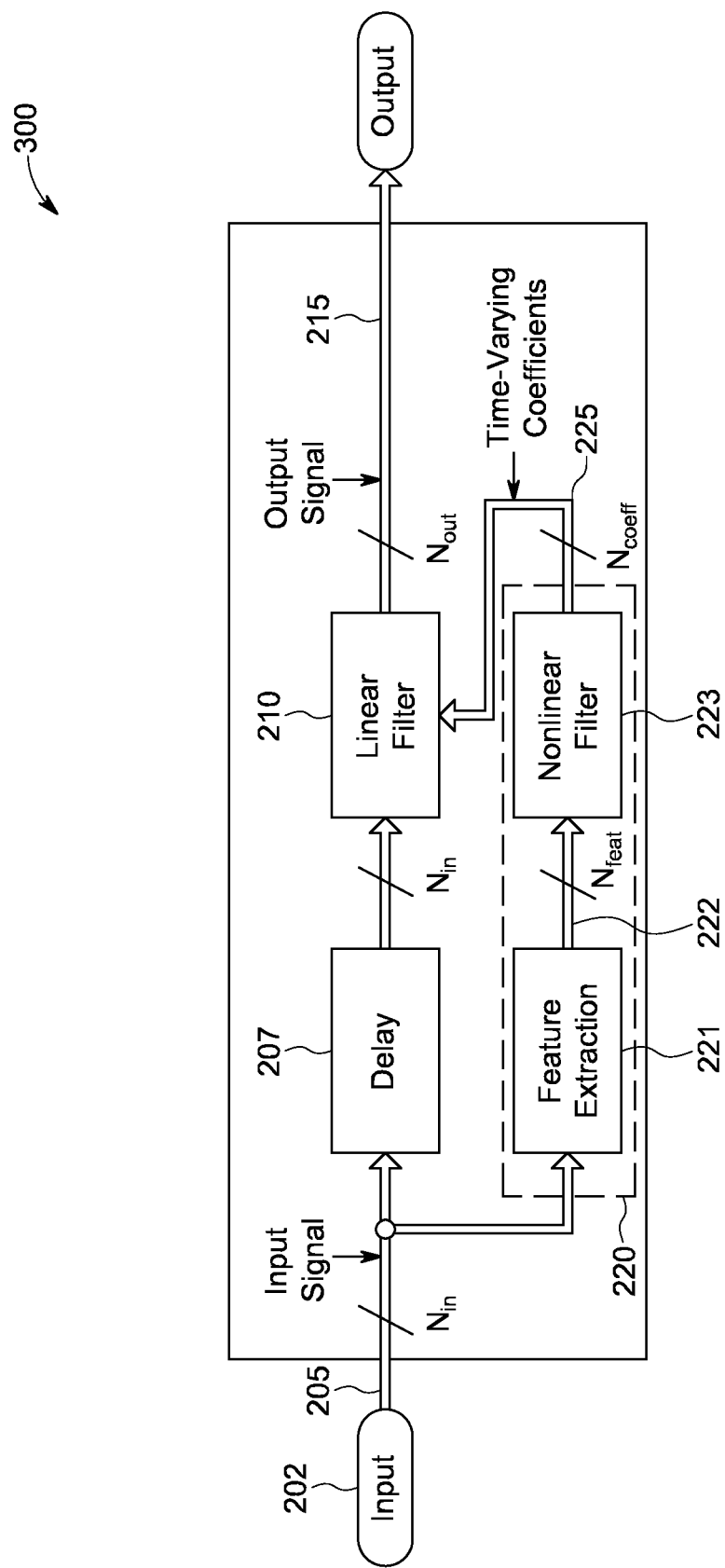
FIG. 3 shows an implementation of a nonlinear filter based on a time-varying linear filter in accordance with the present disclosure.

Another high-level concept of an example nonlinear signal processing device 300 is shown in FIG. 3. Like in FIG. 2, nonlinear signal processing device 300 corresponds to an implementation of a nonlinear filter based on a time-varying linear filter.

Nonlinear signal processing device 300 comprises an input port/terminal 202 for input signal 205. The input terminal 202 is coupled to an input of delay circuit 207. An output of delay circuit 207 is coupled to an input of linear filter circuit 210. An output of linear filter circuit 210 is coupled to an output terminal. Further, input terminal 202 is coupled to an input of feature extraction block/circuit 221. An output of feature extraction block 221 is coupled to an input of nonlinear filter block/circuit 223. An output of nonlinear filter block 223 is coupled to linear filter circuit 210 to provide the time variant filter coefficients 225 to the linear filter circuit 210.

FIG. 3 shows, how an input signal 205 of dimensionality $N_{in}$ is mapped to an output signal 215 of dimensionality $N_{out}$. If single-channel complex baseband signals are considered, the input signal 205 and the output signal 215 each comprise two components, which are called I (in-phase) and Q (quadrature). The signal dimensionality for this case is $N_{in}=N_{out}=2$. To compute the output signal 215, the proposed structure 300 may first delay the input signal 205 by one or more samples with delay circuit 207, followed by a linear filter operation of linear filter 210 with time-varying coefficients (filter taps) 225. The time-varying coefficients 225 may be derived from the input signal 205 by a feature extraction mechanism 221, followed by a nonlinear filter operation 223. In the case of single-channel complex baseband signals, the feature extraction 221 may be the calculation of the absolute value (magnitude) of the input signal 205, which results in a feature dimensionality of $N_{feat}=1$. The non-linear filter block 223 may contain any nonlinear operation that maps an input signal 222 of dimensionality $N_{feat}$ to an output signal 225 of dimensionality $N_{coeff}$ (below, it will be shown that for a low overall complexity, the nonlinear filter block 223 can be implemented mainly based on lookup tables, without the need for multipliers). The dimensionality $N_{coeff}$ is given by the number of coefficients required by the linear filter 210 in the upper signal path. In the case of a complex finite impulse response (FIR) filter with memory depth M, i.e. M+1 filter-taps, it requires M+1 complex filter-coefficients and the output dimensionality of the non-linear filter in the lower path would be $N_{coeff}=2^*(M+1)$.

In the following, a detailed example implementation of the high-level concept from FIGS. 2 and 3 will be described and applied to the example use-case of nonlinear complex baseband filtering for single-channel digital predistortion of radio frequency power amplifiers.

Figure 4A:
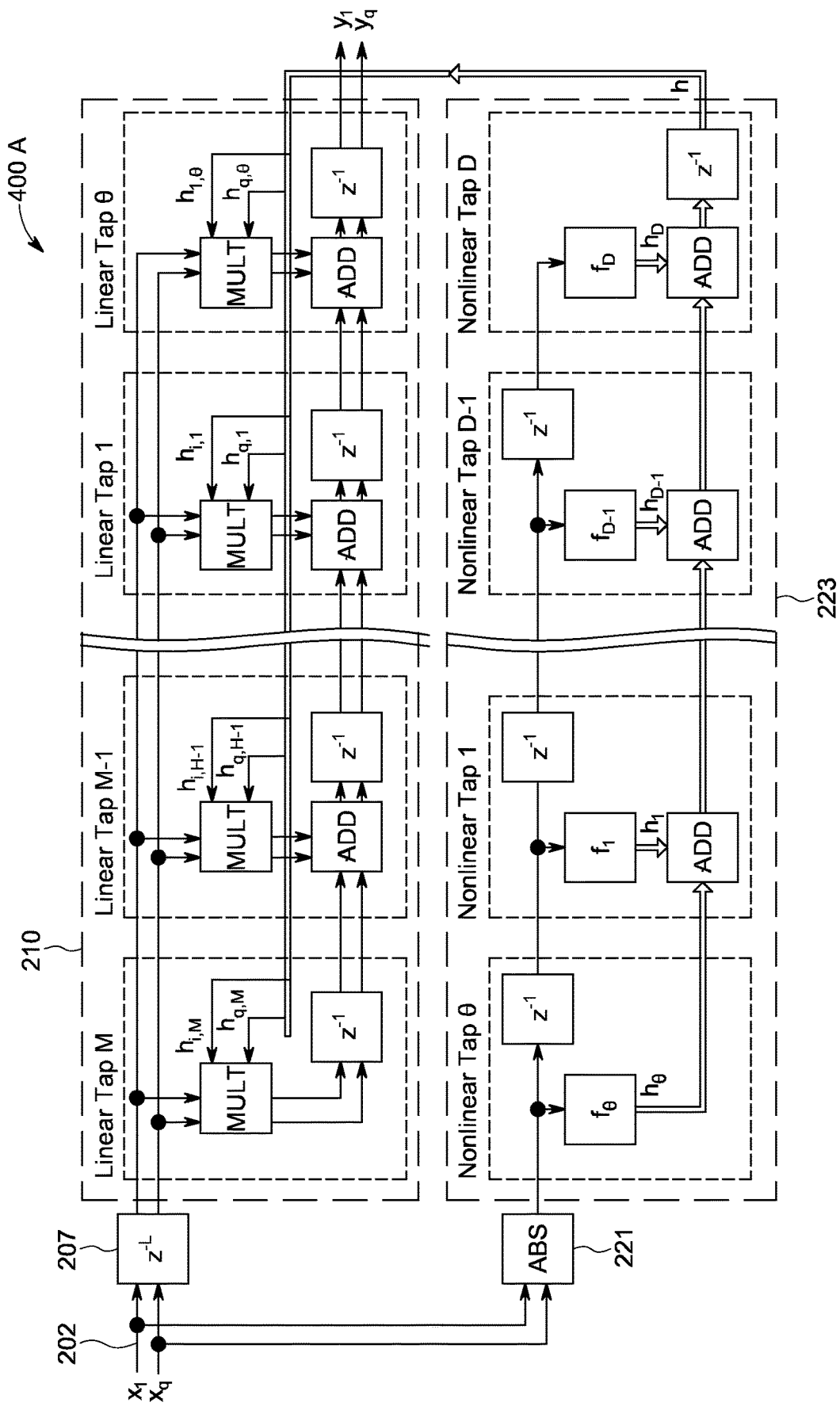
FIG. 4A, B show implementations of complex- and real-valued baseband non-linear filter for digital predistortion.

A proposed implementation of a complex baseband nonlinear filter 400A is shown in FIG. 4A.

Complex baseband nonlinear filter 400A comprises an input port 202 for a digital complex input signal $(x_i, x_q)$. The digital complex input signal $(x_i, x_q)$ is coupled to an input of feature extraction block 221 which is configured to determine an absolute value of complex input signal $(x_i, x_q)$ as output in the illustrated example. The output of feature extraction block 221 is coupled to an input of nonlinear filter circuit 223 comprising D+1 nonlinear filter taps. An output of feature extraction block 221 is coupled to a first nonlinear filter tap 0. Non-linear filter tap 0 is coupled to nonlinear filter tap 1, nonlinear filter tap 1 is coupled to non-linear filter tap 2, and so on. Last nonlinear filter tap D provides an output vector h of time variant complex filter coefficients 225 for linear filter circuit 210. Each nonlinear filter tap comprises a respective delay element $z^{-1}$ coupled to a delay element of a previous tap and a respective single-input multiple-output nonlinear function coupled to the delay element of the previous tap for mapping an absolute value delayed by the previous tap to a respective vector of time-varying complex coefficients. The resulting D+1 vectors $h_0$ to $h_D$ of time-varying complex coefficients are added to obtain the vector h of time variant complex filter coefficients 225.

Further, the digital complex input signal $(x_i, x_q)$ is coupled to an input of delay circuit 207 configured to delay complex input signal $(x_i, x_q)$ by L (L≥0) samples, wherein L may essentially correspond to a delay of the nonlinear filter 223. An output of delay circuit 207 is coupled to an input of linear filter circuit 210 comprising M+1 linear filter taps. Output of delay circuit 207 is coupled to first linear filter tap M. Linear filter tap M is coupled to linear filter tap M−1, linear filter tap M−1 is coupled to linear filter tap M−2, and so forth. Last linear filter tap 0 provides a digital complex output signal $(y_i, y_q)$. Each linear filter tap comprises a complex multiplier (MULT) for multiplying the respective complex time variant filter coefficient with the complex output of delay circuit 207. A complex-valued output signal of the respective multiplier acts as a first input of a respective adder (ADD). An output signal of a respective previous tap acts as a second input of the respective adder. An output signal of the respective adder acts as an input of a respective delay element $z^{-1}$. An output of the respective delay element acts as an output signal of the respective filter tap. The skilled person having benefit from the present disclosure will appreciate that the first linear filter tap M need not have an adder circuit.

This implementation relates to FIG. 3 in the following way:

The block "Delay" 207 from FIG. 3 is represented by the block $z^{-L}$ in FIG. 4A which represents a delay of L samples. The block "Feature Extraction" 221 from FIG. 3 is represented by the block ABS in FIG. 4A, which computes the absolute value (magnitude) of a complex input signal ($x_i$, $x_q$). The block "Linear Filter" 210 from FIG. 3 is represented by the filter-taps "Linear Tap M" down to "Linear Tap 0" in FIG. 4A. These filter taps represent a complex FIR filter in transposed form. The elements of which this filter is constructed are complex multipliers (MULT), complex adders (ADD) and delay elements ($z^{-1}$). The time-varying complex coefficients of this filter are represented by the vector h=[$h_{i,0}$, $h_{q,0}$, ..., $h_{i,M}$, $h_{q,M}$]$^T$. The block "Nonlinear Filter" 223 from FIG. 3 is represented by the filter-taps "Nonlinear Tap 0" up to "Nonlinear Tap D" in FIG. 4A. These filter-taps represent a nonlinear filter structure that is derived from a linear FIR filter in direct form. In contrast to a linear FIR filter, which would contain multipliers, this nonlinear filter contains the single-input multiple-output nonlinear functions $f_0$ up to $f_D$. These nonlinear functions may be implemented by lookup-tables, polynomials, or any other method for implementing nonlinear memoryless mappings.

The practical value of the structure in FIG. 4A is that it can represent a very powerful model for digital predistortion which is called the generalized memory polynomial (GMP) model in a very hardware-efficient way. The number of logic gates for implementing this structure is dominated by the complex multipliers in the linear filter path which scales only with the memory depth of the linear filter part, but not with the memory depth of the nonlinear filter part. The nonlinear filter part can be implemented mainly based on memory, which may give an advantage in terms of power consumption, chip area, and flexibility for reconfiguration.

Beside the complex baseband implementation in FIG. 4A which is used for the digital predistortion of RF power amplifiers or similar nonlinear devices, there may be several other variants of nonlinear signal processing devices that can be derived from the general concept shown in FIGS. 2 and 3.

For example, for the digital predistortion of Cartesian RF DACs, a more effective feature extraction may be given by adding the magnitudes of the signals on I and Q, i.e. using $|x_i|+|x_q|$ instead of the magnitude of the complex signal which is given by $\sqrt{|x_i|^2+|x_q|^2}$.

Beside of this, other variations of the feature extraction block 221 are possible like the following:

Using a feature dimensionality of $N_{feat}>1$.
In this case, the nonlinear filter section 223 should be configured to implement a nonlinear multiple-input, multiple-output (MIMO) mapping, instead of a single-input, multiple-output (SIMO) mapping. This may increase the complexity but could improve the modeling accuracy.

Using a feature extraction 221 with memory.
In this case, the feature extraction 221 may be based on the current input sample plus one or more past input samples. An example would be to use a filtered version of the magnitude of the complex baseband signal as feature.

Figure 4B:
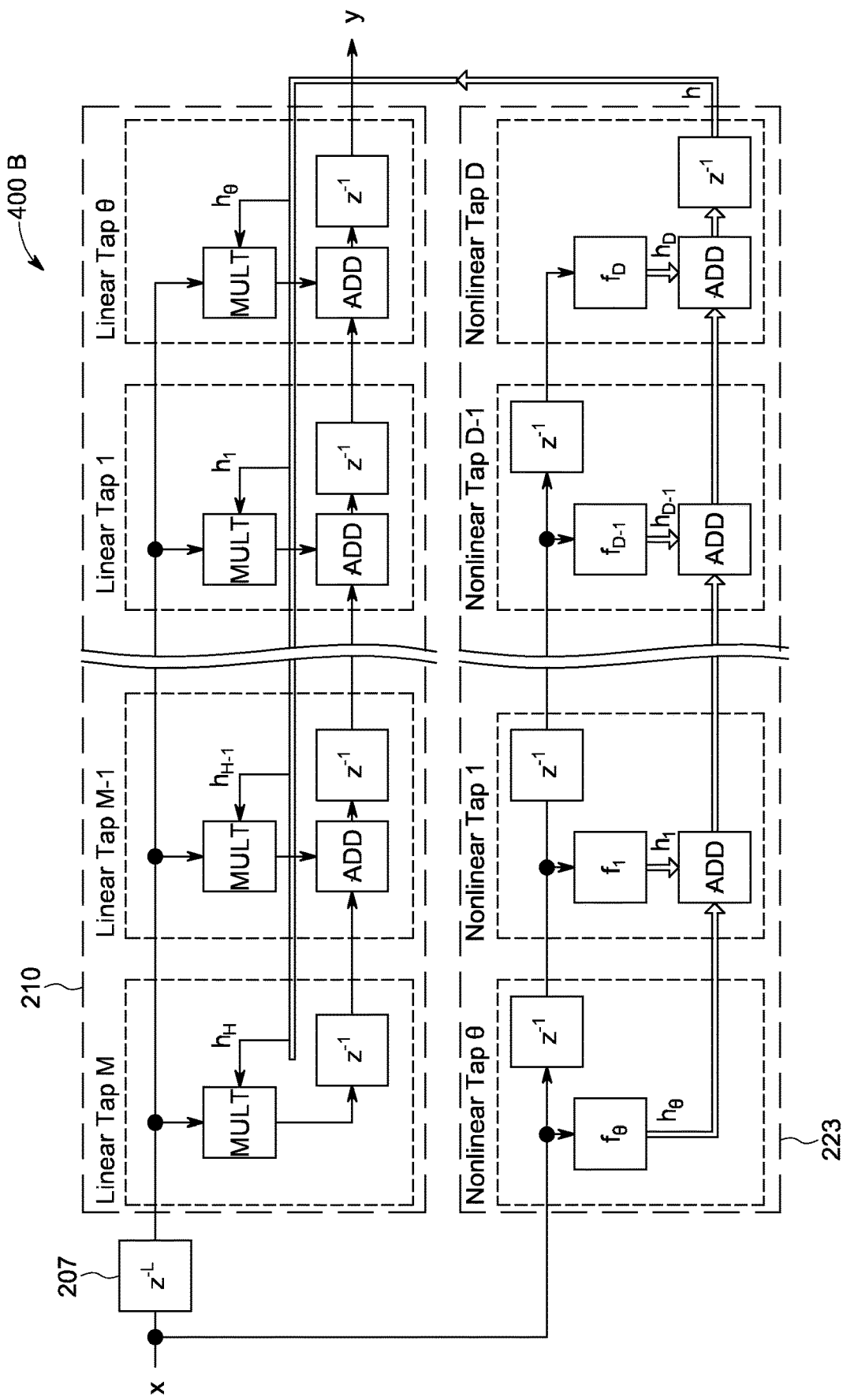

Furthermore, the proposed concept can be used for the digital predistortion of real-valued signals like in cable modems or in audio applications. In this case, the nonlinear signal processing device of FIG. 4A simplifies to FIG. 4B. Here, the linear part comprises a real-valued FIR filter 210 and the nonlinear part 220 generates a real-valued coefficient vector h=[$h_0$, $h_1$, ..., $h_M$]$^T$. In this case, the input signal 205 can be used directly without a dedicated feature extraction block and the lookup tables may process signed inputs.

Real-valued baseband nonlinear filter 400B comprises an input port 202 for a digital real-valued input signal (x). The digital real-valued input signal (x) is coupled to an input of non-linear filter circuit 223 comprising D+1 nonlinear real-valued filter taps. The digital real-valued input signal (x) is coupled to a first nonlinear filter tap 0. Nonlinear filter tap 0 is coupled to nonlinear filter tap 1, nonlinear filter tap 1 is coupled to nonlinear filter tap 2, and so on. Last nonlinear filter tap D provides an output vector h of time variant real-valued filter coefficients 225 for linear filter circuit 210. Each nonlinear filter tap comprises a respective delay element $z^{-1}$ coupled to a delay element of a previous tap and a respective single-input multiple-output nonlinear function coupled to the delay element of the previous tap for mapping an absolute value delayed by the previous tap to a respective vector of time-varying real-valued coefficients. The resulting D+1 vectors $h_0$ to $h_D$ of time-varying real-valued coefficients are added to obtain the vector h of time variant filter coefficients 225.

Further, the digital real-valued input signal (x) is coupled to an input of delay circuit 207 configured to delay real-valued input signal (x) by L (L≥0) samples. An output of delay circuit 207 is coupled to an input of linear filter circuit 210 comprising M+1 real-valued linear filter taps. Output of delay circuit 207 is coupled to first linear filter tap M. Linear filter tap M is coupled to linear filter tap M−1, linear filter tap M−1 is coupled to linear filter tap M−2, and so forth. Last linear filter tap 0 provides a digital real-valued output signal (y). Each linear filter tap comprises a real-valued multiplier (MULT) for multiplying the respective real-valued time variant filter coefficient with the real-valued output of delay circuit 207. A real-valued output signal of the respective multiplier acts as a first input of a respective adder (ADD). An output signal of a respective previous tap acts as a second input of the respective adder. An output signal of the respective adder acts as an input of a respective delay element $z^{-1}$. An output of the respective delay element acts as an output signal of the respective filter tap. The skilled person having benefit from the present disclosure will appreciate that the first linear filter tap M need not have an adder circuit.

Figure 5A:
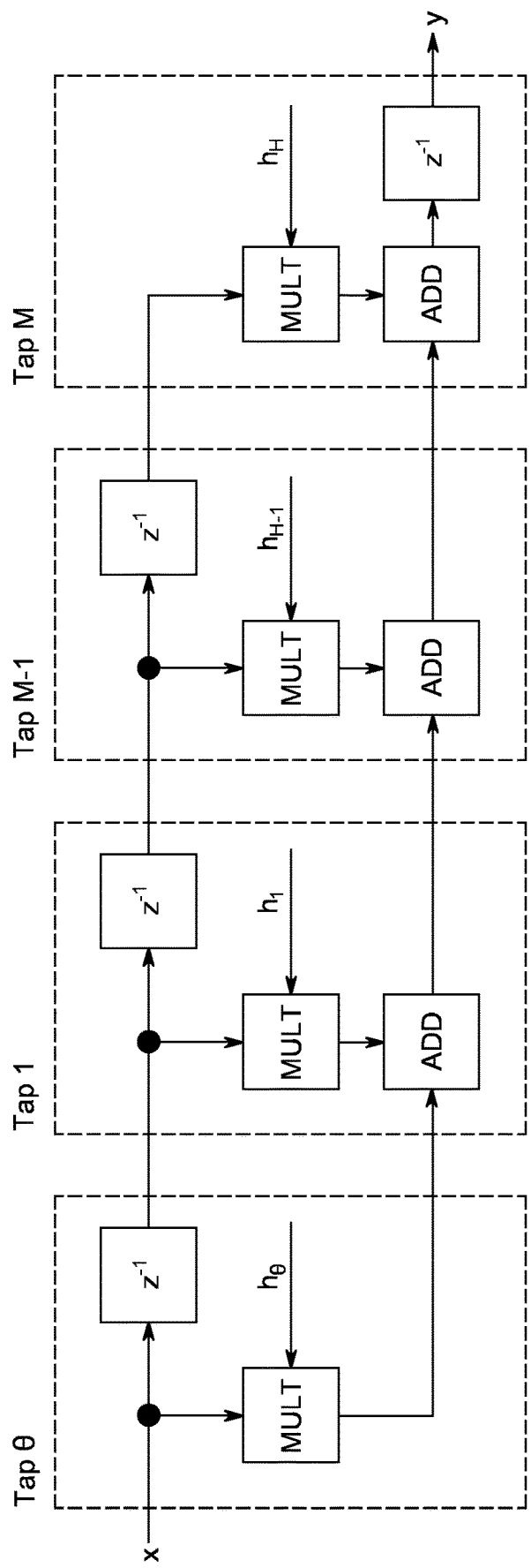
FIG. 5A, B show direct- and transposed form implementations of a linear FIR filter.

As a preliminary to the following proof, the two forms of FIR filter implementations shown in FIG. 4A, B shall be discussed. The nonlinear filter part in FIG. 4A, B follows the direct form implementation that is shown in FIG. 5A. The linear part in FIG. 4A, B follows the transposed form implementation, which is shown in FIG. 5B.

Figure 5B:
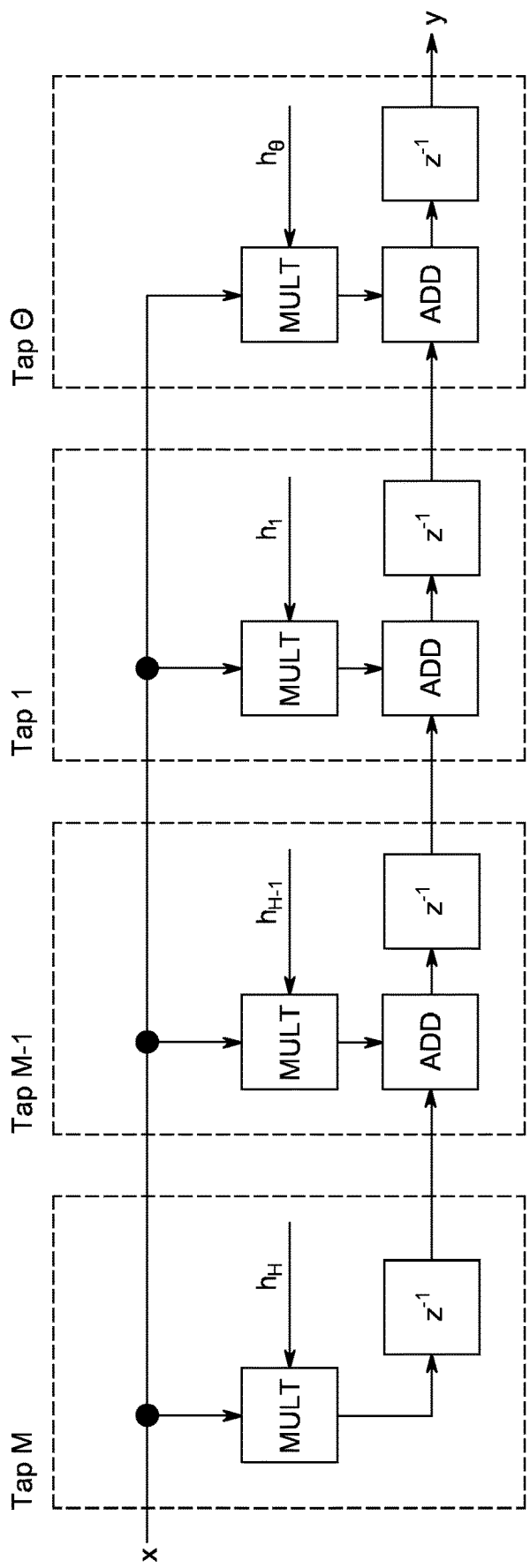

For time-invariant filtering, the structures in FIG. 5A and FIG. 5B are equivalent. The non-linear time-invariant filter 223 in FIG. 4A, B could therefore be based either on the direct or the transposed form. The direct form may be chosen since it requires less memory for implementing the delay elements in this case. (Note the different signal dimensionality at the input and the output.)

For time-variant filtering, the structures in FIG. 5A and FIG. 5B are NOT equivalent. This can be seen from the filtering equations. For the direct form, the time-varying filtering equation is $$y[n+1] = \sum_{m=0}^{M} x[n-m] h_n[m] \qquad (2)$$

whereas for the transposed form, the time-varying filtering equation is $$y[n+1] = \sum_{m=0}^{M} x[n-m] h_{n-m}[m] \qquad (3)$$

The structure in FIG. 4A, B is equivalent to a GMP, only if the time-varying linear filter is implemented in the transposed form. This mainly motivates the choice of this form in FIGS. 4A, B.

In the following, a proof is presented that the structure in FIG. 3 can represent the GMP model. The proof comprises six parts, numbered as Part 1 to Part 6.

Part 1—Original Formulation of the GMP

According to equation (23) in D. R. Morgan, Z. Ma, J. Kim, M. G. Zierdt, and J. Pastalan, "A generalized memory polynomial model for digital predistortion of RF power amplifiers", *IEEE Transactions on Signal Processing*, volume 54, number 10, pages 3852-3860, October 2006, the GMP model may be given by $$y[n] = \sum_{p=1}^{P_0} \sum_{m=0}^{M_0} c_{0,p}[m] x[n-m] |x[n-m]|^{p-1} + \qquad (4)$$

$$\sum_{p=1}^{P_1} \sum_{m=0}^{M_1} \sum_{d=0}^{D_1} c_{1,p}[m,d] x[n-m] |x[n-m-d]|^{p-1} +$$

$$\sum_{p=2}^{P_2} \sum_{m=0}^{M_2} \sum_{d=0}^{D_2} c_{2,p}[m,d] x[n-m] |x[n-m+d]|^{p-1}$$

The model in Eq. (4) comprises the following three components:

First Line: This is the memory polynomial part of the GMP which is the main diagonal of the corresponding Volterra model. In this part of the model, the signal sample x[n−m] and the envelope sample |x[n−m]| have the same delay.

Second Line: This is the lagging-envelope part of the GMP. As the name suggests, the envelope-sample has a higher delay than the signal sample.

Third Line: This is the leading-envelope part of the GMP. As the name suggests, the envelope-sample has a smaller delay than the signal sample. Note that for some samples, the leading-envelope terms are non-causal. For an implementation, the model must therefore be reformulated as a causal system, as will be described in Part 6 of this proof.

Part 2—Simplified Formulation of the GMP

As a first step to derive an implementation of (4), it may be simplified to the one-line equation $$y[n] = \sum_{p=1}^{P} \sum_{m=0}^{M} \sum_{d=-D_2}^{D_1} c_{3,p}[m,d] x[n-m] |x[n-m-d]|^{p-1} \qquad (5)$$

where the coefficients are related to the original ones by $$c_{3,p}[m,d] = \begin{cases} c_{0,p}[m] & 1 \le p \le P_0 \text{ and } 0 \le m \le M_0 \text{ and } d = 0 \\ c_{1,p}[m,+d] & 2 \le p \le P_1 \text{ and } 0 \le m \le M_1 \text{ and } d > 0 \\ c_{2,p}[m,-d] & 2 \le p \le P_2 \text{ and } 0 \le m \le M_2 \text{ and } d < 0 \\ 0 & \text{otherwise} \end{cases} \qquad (6)$$

and the nonlinear order and memory depth are related to the original ones by $$P = \max(P_0, P_1, P_2) \; M = \max(M_0, M_1, M_2) \qquad (7)$$

Part 3—Comparison of Original and Simplified Formulation

By careful inspection of (4)-(7) it should be possible to see that the one-line equation (5) indeed represents the same mathematical operation as the three-line equation (4). The simplified form of (5) is achieved by removing restrictions on the index variables p, m, and d which are present in (4), but are not present in (5) anymore. For example, in (4), the first-order terms are only present in the memory polynomial part, but not in the lagging or leading envelope parts. In (5) on the other hand, there is no such restriction, resulting in a larger number of overall terms of the summation in (5), compared to the three summations in (4). However, the mathematical operations of (4) and (5) are still equivalent, since due to the coefficient definition in (6), it is ensured that the additional terms in (5) are weighted by zero-valued coefficients.

From a practical perspective, both (4) and (5) are useful. In the context of model fitting, the formulation in (4) is advantageous, since it generates only unique basis functions and it allows to choose different nonlinear orders and memory depths for the three individual model components. On the other hand, in the context of model implementation, the formulation in (5) is advantageous, since it simplifies the mathematical formalism, which helps in finding an efficient structure for implementation.

Part 4—Replacing the Polynomial Formulation by General Nonlinear Basis Functions In (4) and (5), the nonlinearity is modeled by conventional polynomial basis functions which are applied to the magnitude of the input signal. The choice of this type of basis function is, however, not necessary, and in general it is advantageous to generalize the model to a formulation that is independent from a specific choice of nonlinear basis function. To generalize (5) in this way, we move the summation over the nonlinear order inside, which allows us to write (5) as $$y[n] = \sum_{m=0}^{M} \sum_{d=-D_2}^{D_1} x[n-m] f_{m,d}(|x[n-m-d]|) \qquad (8)$$

where the nonlinear basis functions are given by $$f_{m,d}(a) = \sum_{p=1}^{P} c_{3,p}[m,d] a^{p-1} \qquad (9)$$

Note that the conventional polynomial in (8) can be replaced by any other method for modeling a memoryless nonlinear function, like lookup tables, piecewise polynomials or other methods.

Part 5—Separating the Model into a Time-Varying Linear and a Nonlinear Part

A key step for an efficient implementation of (8) is the separation of the linear part form the nonlinear part. For this purpose, we move the sum over d further inside, resulting in $$y[n] = \sum_{m=0}^{M} x[n-m] \sum_{d=-D_2}^{D_1} f_{m,d}(|x[n-m-d]|) \qquad (10)$$

Then we replace the inner sum in (10) by a new function so that we can reformulate (10) by $$y[n] = \sum_{m=0}^{M} x[n-m]h_{n-m}[m] \qquad (11)$$

where the new function is given by $$h_n[m] = \sum_{d=-D_2}^{D_1} f_{m,d}(|x[n-d]|) \qquad (12)$$

Note that by resubstituting (12) into (11), it can be easily verified that the new formulation is equivalent to (10). The advantage of representing the GMP by (11)-(12) is that now we have separated the linear part from the nonlinear part. The linear part in (11) can be implemented by the transposed FIR structure that was discussed above. The nonlinear part in (12) can be implemented by a time-invariant nonlinear structure that has a similar form as a linear FIR structure with the only difference that the multiplications are replaced by non-linear functions.

Part 6—Mapping the Model to the Hardware

Up to now, we have shown that (11)-(12) can be used to exactly represent the GMP model in (4). In the last step of this proof we will show how this model relates to the structure in FIGS. 4A, B.

As mentioned in Part 1, the original formulation of the GMP contains non-causal terms in the leading-envelope part that cannot be implemented directly in hardware. Furthermore, the mathematical model does not account for the delay of operations that are necessarily introduced by a hardware implementation. Finally, the mathematical formulation uses complex quantities, whereas for the hardware implementation, the real and imaginary parts of complex quantities may be represented separately, since only real quantities can finally be implemented.

To account for the problem of causality and the delay of operations, FIG. 4A, B contains a delay 207 of L samples in front of the linear filter 210. Since there is an additional delay of one sample at the output of the linear filter 210, the overall latency of the structure in FIG. 4A, B is L+1 samples. To ensure that, apart from this latency, the behavior of the hardware is equivalent to the GMP model, the value of L should be set correctly, and the single-input multiple-output nonlinear functions $f_0$ up to $f_D$ in the nonlinear filter section 223 of the hardware should be mapped correctly to the single-input single-output complex non-linear functions $f_{m,d}$ (a) that were used in the mathematical model.

Note that in the example hardware implementations of FIGS. 4A, B, the nonlinear taps are numbered from 0 up to D, whereas in the mathematical model, it was convenient to use an index variable range $-D_2 \leq d \leq +D_1$. The number of values for d is of course the same as the number of nonlinear taps, given by $$D = D_1 + D_2 \qquad (13)$$

To establish a mapping from $f_{m,d}$ (a) to the hardware nonlinearities $f_0$ up to $f_D$, we first shift the range of the index variable d to the values from 0 up to D, given by the definition $$f_{m,d}^{(d \geq 0)}(a) = f_{m,-D_2+d}(a) \qquad (14)$$

Then, the newly defined function is related to the hardware nonlinearities by $$f_d(a) = \begin{bmatrix} \text{Real } \{f_{0,d}^{(d \geq 0)}(a)\} \\ \text{Imag}\{f_{0,d}^{(d \geq 0)}(a)\} \\ \ldots \\ \text{Real } \{f_{M,d}^{(d \geq 0)}(a)\} \\ \text{Imag}\{f_{M,d}^{(d \geq 0)}(a)\} \end{bmatrix} \qquad (15)$$

The required delay L in front of the linear filter section in FIG. 4A, B is given by $$L = D_{ABS} + D_{LUT} + D_2 + 1 \qquad (16)$$

where $D_{ABS}$ is the delay of the ABS operation, $D_{LUT}$ is the delay of the hardware nonlinearities, $D_2$ is the number of leading-envelope diagonals of the GMP model which is also the index shift in (14), and the one additional sample of delay in (16) accounts for the output register delay of the nonlinear filter section in FIGS. 4A, B.

The proposed nonlinear signal processing devices could be part of a TX VLSI section of a Wi-Fi chipset. To detect the presence of such nonlinear signal processing devices within the VLSI circuit, the reverse-engineering methods could be used. From high level visual inspection, one could locate such nonlinear signal processing devices as a combination of memory and logic in the digital TX section of a Wi-Fi chipset, operating synchronously at a clock frequency which is several times (e.g., 3 to 5) the highest signal bandwidth. Actual detection might require the reverse-engineering of parts of the netlist of a manufactured VLSI chip. If the type of DPD structure is known (for example based on product literature or firmware), one could identify such nonlinear signal processing devices by the number of connected memory blocks within the VLSI implementation of the DPD structure. Product literature could indicate the usage of digital predistortion (DPD) either explicitly as a selling point of the product, or implicitly, by providing dedicated RX feedback pins additionally to the regular RX input pins of the chip.

Figure 6:
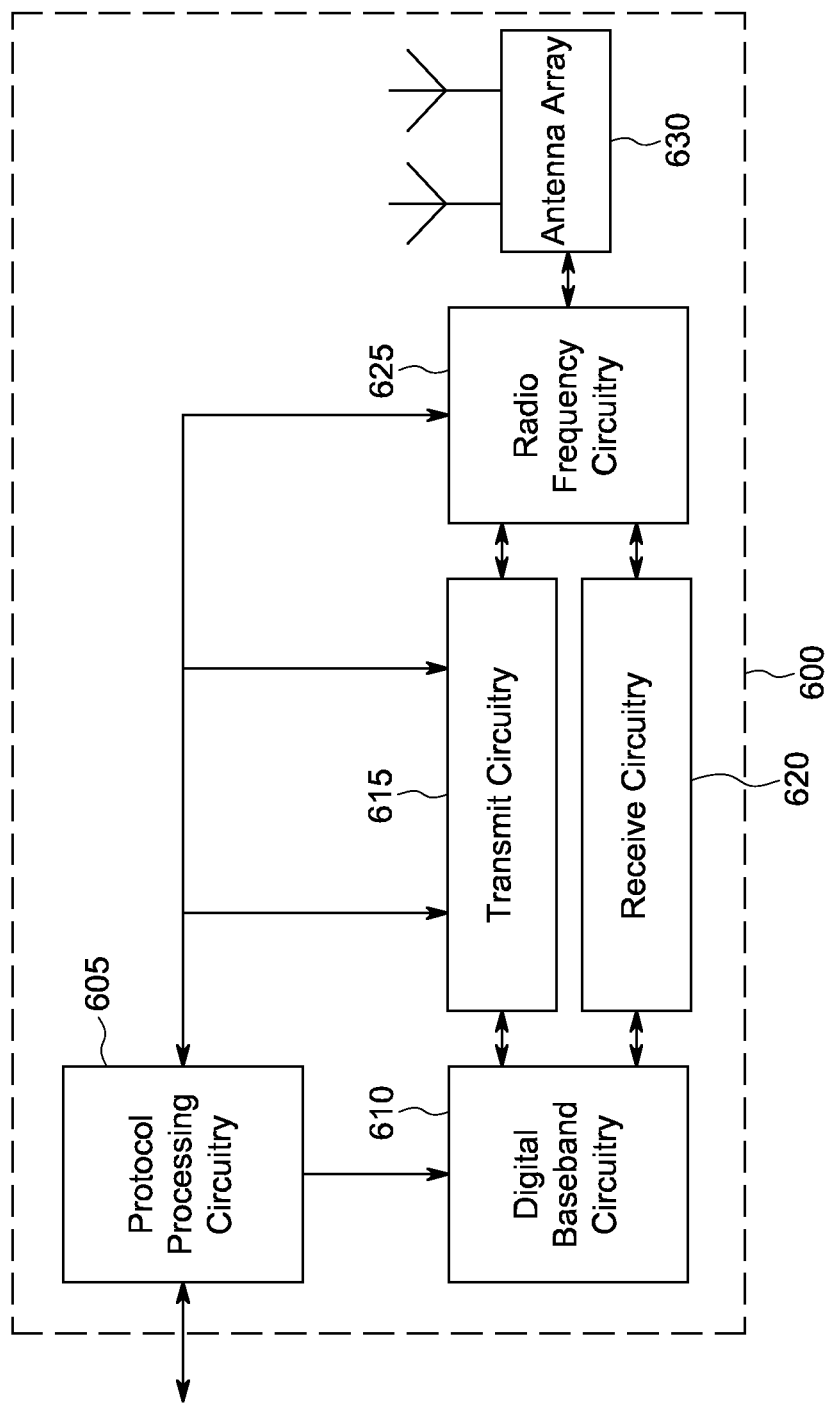
FIG. 6 shows an exemplary wireless communication circuitry in which examples of the proposed nonlinear signal processing concept may be used for digital predistortion of RF-PAs.

FIG. 6 illustrates an exemplary millimeter wave communication circuitry 600, such as a Wi-Fi communication circuitry, in which examples of the proposed nonlinear signal processing devices may be used. Circuitry 600 is alternatively grouped according to functions. Components as shown in 600 are shown here for illustrative purposes and may include other components not shown here in FIG. 6.

Millimeter wave communication circuitry 600 may include protocol processing circuitry 605, which may implement one or more of medium access control (MAC), radio link control (RLC), packet data convergence protocol (PDCP), radio resource control (RRC) and non-access stratum (NAS) functions. Protocol processing circuitry 605 may include one or more processing cores (not shown) to execute instructions and one or more memory structures (not shown) to store program and data information.

Millimeter wave communication circuitry 600 may further include digital baseband circuitry 610, which may implement physical layer (PHY) functions including examples of the proposed nonlinear signal processing, one or more of hybrid automatic repeat request (HARM) functions, scrambling and/or descrambling, coding and/or decoding, layer mapping and/or de-mapping, modulation symbol mapping, received symbol and/or bit metric determination, multi-antenna port pre-coding and/or decoding which may include one or more of spacetime, space-frequency or spatial coding, reference signal generation and/or detection, preamble sequence generation and/or decoding, synchronization sequence generation and/or detection, control channel signal blind decoding, and other related functions.

Millimeter wave communication circuitry 600 may further include transmit circuitry 615, receive circuitry 620 and/or antenna array circuitry 630. The transmit circuitry 615 may include one or more of digital to analog converters (DACs) 640, analog baseband circuitry 645, up-conversion circuitry 650 and filtering and amplification (PA) circuitry 655. Millimeter wave communication circuitry 600 may further include radio frequency (RF) circuitry 625. In an aspect of the disclosure, RF circuitry 625 may include multiple parallel RF chains for one or more of transmit or receive functions, each connected to one or more antennas of the antenna array 630. In an aspect of the disclosure, protocol processing circuitry 605 may include one or more instances of control circuitry (not shown) to provide control functions for one or more of digital baseband circuitry 610, transmit circuitry 615, receive circuitry 620, and/or radio frequency circuitry 625.

The following examples pertain to further embodiments.

Example 1 is a nonlinear signal processing device comprising a linear filter circuit configured to filter an input signal to generate a filtered output signal, and a coefficient generation circuit configured to generate time variant filter coefficients for the linear filter circuit based on a nonlinear mapping of the input signal.

In Example 2, the coefficient generation circuit of Example 1 is configured to extract at least one time variant numerical feature from the input signal and to generate the time variant filter coefficients based on a time invariant nonlinear mapping of the extracted time variant numerical feature.

In Example 3, the numerical feature of Example 2 comprises an absolute value, a magnitude, a distance, or a norm of the input signal.

In Example 4, the input signal of any one of Examples 2 or 3 is a digital input signal and wherein the coefficient generation circuit is configured to extract the time variant numerical feature for each sample of the digital input signal.

In Example 5, the coefficient generation circuit of any one of Examples 2 to 4 comprises a nonlinear filter circuit configured to map the at least one extracted time variant numerical feature to the time variant filter coefficients.

In Example 6, the nonlinear filter circuit of Example 5 comprises a plurality of non-linear FIR filter taps, wherein each nonlinear FIR filter tap is configured to delay and map the numerical feature to a respective filter tap output vector based on a respective time invariant nonlinear function.

In Example 7, the nonlinear filter circuit of Example 6 is configured to generate the time variant filter coefficients based on a sum of the filter tap output vectors of the nonlinear FIR filter taps.

In Example 8, the respective nonlinear functions corresponding to the nonlinear FIR filter taps of Example 6 or 7 are implemented based on lookup-tables and/or polynomials.

In Example 9, the nonlinear filter circuit of any one of the Examples 5 to 8 comprises a non-linear FIR filter implemented in direct or transposed form.

In Example 10, the linear filter circuit of any one of the previous Examples comprises a linear FIR filter implemented in transposed form.

In Example 11, the nonlinear signal processing device of any one of the previous Examples further comprises delay circuitry coupled between an input terminal and the linear filter circuit, wherein the delay circuitry is configured to delay the input signal by one or more samples.

In Example 12, a delay of the delay circuitry of Example 11 corresponds to a signal processing delay of the coefficient generation circuit.

Example 13 is a method of nonlinear signal processing, the method comprising generating time variant filter coefficients for a linear filter circuit based on a nonlinear mapping of an input signal, and filtering the input signal with the linear filter circuit using the time variant filter coefficients to generate a filtered output signal.

Example 14 is a transmitter circuit comprising a linear digital filter circuit configured to filter a complex-valued baseband signal to generate a complex-valued predistorted baseband signal, a coefficient generation circuit configured to generate time variant complex filter coefficients for the linear filter circuit based on a nonlinear mapping of the complex input signal, wherein the linear digital filter circuit and the time variant complex filter coefficients mimic a nonlinear distortion of an RF power amplifier.

In Example 15, the transmitter circuit of Example 14 further comprises RF circuitry including the RF power amplifier configured to amplify an RF version of the predistorted baseband signal.

In Example 16, the transmitter circuit of Example 14 or 15 is a Wi-Fi transmitter circuit.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

The invention claimed is:

1. A nonlinear signal processing device, comprising:
a linear filter circuit configured to filter an input signal to generate a filtered output signal; and
a coefficient generation circuit configured to generate time variant filter coefficients for the linear filter circuit based on a nonlinear mapping of the input signal.

2. The nonlinear signal processing device of claim 1, wherein the coefficient generation circuit is configured to extract at least one time variant numerical feature from the input signal and to generate the time variant filter coefficients based on a time invariant nonlinear mapping of the extracted at least one time variant numerical feature.

3. The nonlinear signal processing device of claim 2, wherein the at least one time variant numerical feature comprises an absolute value, a magnitude, a distance, or a norm of the input signal.

4. The nonlinear signal processing device of claim 2, wherein the input signal is a digital input signal and wherein the coefficient generation circuit is configured to extract the at least one time variant numerical feature for each sample of the digital input signal.

5. The nonlinear signal processing device of claim 2, wherein the coefficient generation circuit comprises a nonlinear filter circuit configured to map the at least one extracted time variant numerical feature to the time variant filter coefficients.

6. The nonlinear signal processing device of claim 5, wherein the nonlinear filter circuit comprises a plurality of nonlinear finite impulse response (FIR) filter taps, wherein each nonlinear FIR filter tap is configured to delay and map the at least one time variant numerical feature to a respective filter tap output vector based on a respective time invariant nonlinear function.

7. The nonlinear signal processing device of claim 6, wherein the nonlinear filter circuit is configured to generate the time variant filter coefficients based on a sum of the filter tap output vectors of the plurality of nonlinear FIR filter taps.

8. The nonlinear signal processing device of claim 6, wherein the respective nonlinear functions corresponding to the plurality of nonlinear FIR filter taps are implemented based on lookup-tables and/or polynomials.

9. The nonlinear signal processing device of claim 5, wherein the nonlinear filter circuit comprises a nonlinear FIR filter implemented in direct or transposed form.

10. The nonlinear signal processing device of claim 1, wherein the linear filter circuit comprises a linear FIR filter implemented in transposed form.

11. The nonlinear signal processing device of claim 1, further comprising delay circuitry coupled between an input terminal and the linear filter circuit, wherein the delay circuitry is configured to delay the input signal by one or more samples.

12. The nonlinear signal processing device of claim 11, wherein a delay of the delay circuitry corresponds to a signal processing delay of the coefficient generation circuit.

13. A method of nonlinear signal processing, the method comprising:
generating time variant filter coefficients for a linear filter circuit based on a nonlinear mapping of an input signal; and
filtering the input signal with the linear filter circuit using the time variant filter coefficients to generate a filtered output signal.

14. A transmitter circuit, comprising:
a linear digital filter circuit configured to filter a complex-valued baseband signal to generate a complex-valued predistorted baseband signal; and
a coefficient generation circuit configured to generate time variant complex filter coefficients for the linear filter circuit based on a nonlinear mapping of the complex input signal,
wherein the linear digital filter circuit and the time variant complex filter coefficients mimic a nonlinear distortion of a radio frequency (RF) power amplifier.

15. The transmitter circuit of claim 14, further comprising RF circuitry including the RF power amplifier configured to amplify an RF version of the complex-valued predistorted baseband signal.

16. The transmitter circuit of claim 14, wherein the transmitter circuit is a Wi-Fi transmitter circuit.

* * * * *